United States Patent [19]
Bai et al.

[11] Patent Number: 6,023,573
[45] Date of Patent: Feb. 8, 2000

[54] APPARATUS AND METHOD FOR ANALYZING CIRCUITS USING REDUCED-ORDER MODELING OF LARGE LINEAR SUBCIRCUITS

[75] Inventors: Zhaojun Bai, Lexington, Ky.; Peter Feldmann, Short Hills; Roland W. Freund, New Providence, both of N.J.

[73] Assignee: Lucent Technologies, Inc., Murray Hill, N.J.

[21] Appl. No.: 09/240,432

[22] Filed: Jan. 29, 1999

Related U.S. Application Data

[63] Continuation-in-part of application No. 09/144,767, Sep. 1, 1998, abandoned.

[51] Int. Cl.[7] .................................................. G06F 17/50
[52] U.S. Cl. ........................ 395/500.23; 395/500.34
[58] Field of Search ......................... 395/500.23, 500.34, 395/500.05, 500.03

[56] References Cited

U.S. PATENT DOCUMENTS

| | | | |
|---|---|---|---|
| 5,163,015 | 11/1992 | Yokota | 364/578 |
| 5,313,398 | 5/1994 | Rohrer et al. | 364/468 |
| 5,379,231 | 1/1995 | Pillage et al. | 364/488 |
| 5,469,366 | 11/1995 | Yang et al. | 364/489 |
| 5,537,329 | 7/1996 | Feldmann et al. | 364/489 |
| 5,629,845 | 5/1997 | Liniger | 364/172 |
| 5,689,685 | 11/1997 | Feldmann et al. | 395/500 |

OTHER PUBLICATIONS

"Reduced–Order Modeling of Large Linear Subcircuits via a Block Lanczos Algroithm", P. Feldmann and R.W. Freund, Copyright 1995, IEEE Catalog No. 95CH35812. No p #s.

"Reduced–Order Modeling of Large Passive Linear Circuits by Means of the SyPVL Algorithm", R.W. Freund and P. Feldmann, Copyright 1996, IEEE. No p #s.

*Primary Examiner*—Kevin J. Teska
*Assistant Examiner*—Leigh Marie Garbowski
*Attorney, Agent, or Firm*—Synnestvedt & Lechner LLP

[57] ABSTRACT

A method and apparatus for generating and analyzing reduced-order models of linear circuits. The method and apparatus generates a characteristic tridiagonal matrix using a look-ahead Lanczos procedure and then checks the matrix for stability and passivity. If the matrix is not stable and passive, the matrix is modified via a partial Padé via Lanczos approximation algorithm and then rechecked for passivity and stability. The process is iterated until a passive and stable model is generated. When a satisfactory matrix is generated, a Padé approximant of a transfer function of the circuit is computed and the frequency response of this circuit is generated and displayed.

37 Claims, 6 Drawing Sheets

APPARATUS AND METHOD FOR ANALYZING CIRCUITS USING REDUCED-ORDER MODELING OF LARGE LINEAR SUBCIRCUITS

RELATED APPLICATIONS

This application is a continuation-in-part of U.S. application Ser. No. 09/144,767 filed on Sep. 1, 1998, abandoned.

FIELD OF THE INVENTION

The invention pertains to a method and apparatus for analyzing electrical circuits. More particularly, the invention pertains to a method and apparatus for analyzing linear subcircuits of a larger circuit by means of a Lanczos-type procedure to determine a scalar Padé approximant of the transfer function of the linear subcircuit.

BACKGROUND OF THE INVENTION

Electrical circuits typically are comprised of linear, passive circuit elements, such as resistors, inductors, and capacitors as well as non-linear and active circuit elements, such as transistors and power sources. In the process of designing circuits, particularly large-scale integrated circuits, it is normal practice to mathematically model the circuit to simulate performance. Particularly, the outputs of the circuit are modeled as a function of the inputs of the circuit. The mathematical model is used to determine various response characteristics of the circuit.

In our prior U.S. patent application Ser. No. 08/269,230, filed Jun. 30, 1994, now U.S. Pat. No. 5,537,329, Ser. No. 08/489,270, filed Jun. 9, 1995, now U.S. Pat. No. 5,689,685, and Ser. No. 08/904,233, filed Jul. 31, 1997, all of which are incorporated herein by reference, we disclosed new methods and apparatus for modeling linear subcircuits within a larger electrical circuit.

An electrical circuit, such as an integrated circuit, frequently contains large portions thereof comprised entirely of linear circuit elements. For instance, a wire or other connector usually can be modeled as a network of resistances and capacitances. Accordingly, the entire interconnect structure between a last non-linear circuit element in an integrated circuit and the end of a package pin can be mathematically modeled as a linear subcircuit.

The modeling of the larger overall circuit can be extremely complex in large scale integrated (LSI) circuits and very large scale integrated (VLSI) circuits. Our aforementioned patent applications disclose techniques for modeling the linear subcircuit portions within the larger circuit by a greatly reduced model compared to the equations describing the linear subcircuit.

Referring to our aforementioned patent applications, in U.S. patent application Ser. No. 08/269,230, we disclosed a Padé via Lanczos method for determining a scalar Padé approximant of a transfer function of a linear circuit for use in determining, with substantial accuracy, the frequency response behavior of the linear circuit.

In U.S. patent application Ser. No. 08/489,270, we disclosed an extension to the previous application in which the Padé via Lanczos method was extended to matrix transfer functions. More specifically, U.S. patent application Ser. No. 08/489,270 discloses a numerically stable method to determine a matrix Padé approximation of the frequency response of a linear circuit or subcircuit with little numerical degradation, and providing an acceptable computational cost per order of approximation. The method reduces the very large matrices used to represent the p by p matrix transfer function to a pair of much smaller matrices so that the resulting approximate matrix transfer function has basically the same characteristics as the original matrix transfer function. Using the method and apparatus disclosed therein, the original matrix can be reduced to any particular size desired. The accuracy of the approximation depends on the order of reduction in size of the matrices. Generally, the matrices can be reduced to a very large extent without significant decrease in accuracy.

In U.S. patent application Ser. No. 08/904,223, we disclosed a specialized adaptation of the method and apparatus of U.S. patent application Ser. No. 08/489,270, discussed above, for use in connection with passive, linear circuits or subcircuits in which the matrices are guaranteed to be symmetric. That method can reduce circuit simulation processing load by as much as one half for passive linear circuits. Further, when the additional condition is met that the circuit contains only two types of linear circuit elements, the matrices are guaranteed to be not only symmetric, but also positive definite, which guarantees stability and passivity of the approximation.

In the method and apparatus of application Ser. No. 08/904,223, however, linear circuits that contain R, L and C circuit elements as well as linear circuits with different input and output vectors are not guaranteed to result in a symmetric Lanczos matrix. Therefore, they are not guaranteed to result in a stable and passive Padé approximate transfer function. However, if the original circuit is stable and possibly passive, then, in some applications, it is crucial that the reduced-order models also have these properties.

Therefore, it is an object of the present invention to provide an improved method and apparatus for generating a Padé approximant of a transfer function of a linear circuit.

It is a further object of the present invention to provide an improved method and apparatus for generating a partial Padé approximant of a transfer function of a linear circuit that is passive and stable.

It is another object of the present invention to provide an improved method and apparatus for modifying a Lanczos matrix corresponding to a Padé approximant of a transfer function of a linear circuit that is not passive and stable so as to make it passive and stable with as minimal a sacrifice in the accuracy of the approximant as possible.

SUMMARY OF THE INVENTION

The present invention is a method and apparatus for analyzing linear circuits using reduced-order mathematical approximations thereof generated by a partial Padé via Lanczos type procedure. It includes a processing unit having a processor, associated memory, and stored programs. The memory stores circuit characteristic data representing the circuit. The stored programs include a matrix reduction program for causing the processor to process the circuit characteristic data and to generate block tri-diagonal matrix data representing a block tri-diagonal matrix representative of the circuit being modeled. Specifically, the circuit characteristic data representing the circuit is input through an input device and stored in the memory. A characteristic matrix is generated from the circuit characteristic data and that matrix is iteratively reduced to the aforementioned block tri-diagonal matrix by a look-ahead Lanczos procedure. This matrix is herein termed the original Lanczos matrix.

The stored programs then check the tri-diagonal matrix to determine if the associated reduced-order model is stable and passive. In order to determine stability, the matrix is checked to determine if there are any poles of the rational transfer function of the circuit in the right half of the complex plane. Passivity is checked by determining if there are any zeros of the rational function in the right half of the complex plane and whether additional conditions are met.

If the matrix is passive and stable, the programs generate frequency response data for the circuit from the matrix. However, if the matrix is not stable and passive, the stored programs determine alternate locations for these poles and/or zeros and compute a corresponding partial Padé approximation based thereupon. Particularly, a vector $x_n$ is generated that is added to the last column in the Lanczos matrix. The partial Padé approximation alters the location of all poles and zeros, not just the poles and zeros in the right half of the complex plane. The new resultant matrix is then checked again for stability and passivity using eigenvalue based criteria. If the new matrix is not passive and stable, the process of altering the matrix is repeated until passivity and stability are achieved.

DETAILED DESCRIPTION OF THE INVENTION

I. Introduction

Figure 1:
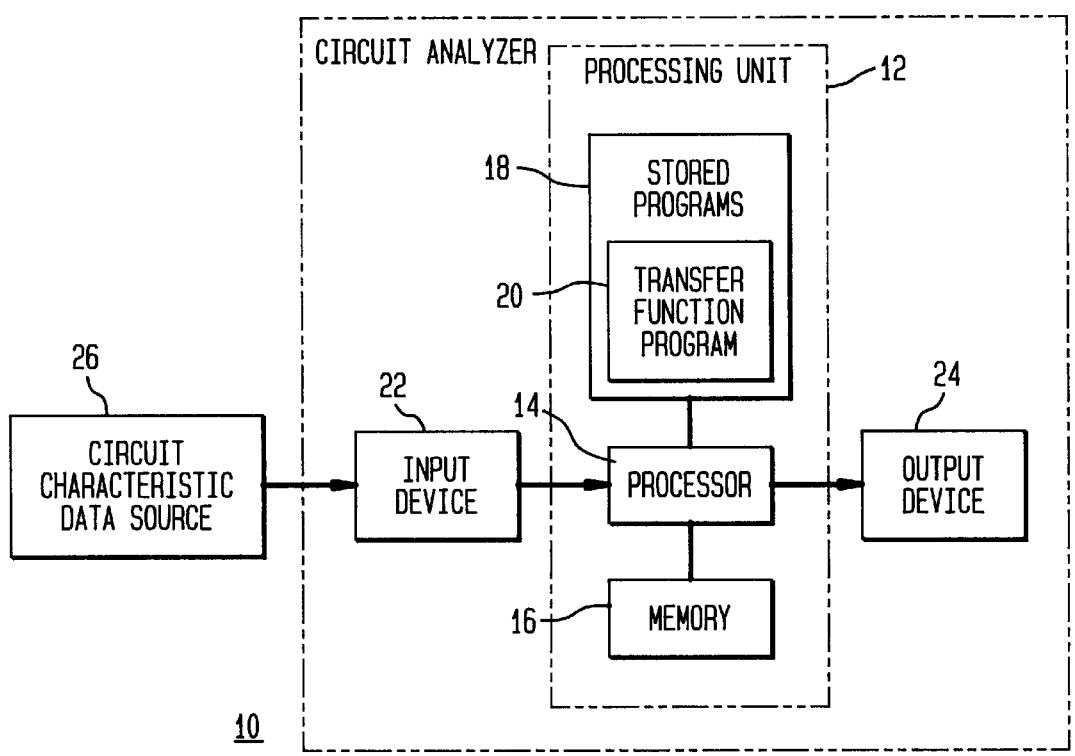
FIG. 1 is a block diagram of the components of an exemplary apparatus in accordance with the present invention.

Referring to the drawings (in which like reference numerals identify similar or identical elements) and particularly FIG. 1, the present disclosure describes an apparatus and method implementing a circuit analyzer 10, which includes a processing unit 12 having a processor 14, memory 16, and stored programs 18, including a transfer function program 20; an input device 22; and an output device 24.

The present invention is a further improvement on our work disclosed in the aforementioned patent application Ser. Nos. 08/269,230 (now U.S. Pat. No. 5,537,329), 08/489,270, now U.S. Pat. No. 5,689,685, and 08/904,233. A reduced order tri-diagonal Lanczos matrix (hereinafter termed the "original" Lanczos matrix) is generated to represent the transfer function of a linear circuit generally in accordance with the method and apparatus disclosed in our application Ser. No. 08/904,233. That matrix is then checked to determine if it will generate a stable and passive Padé approximant transfer function. If so, the transfer function is generated and a frequency response of the transfer function is generated and displayed to the user. However, if the original Lanczos matrix is not stable, the matrix is modified by a partial Padé approximation algorithm in which a vector, x, is generated and then added to the last column of the original Lanczos matrix to generate a modified tri-diagonal Lanczos matrix that is, hopefully, stable and passive and that has a corresponding transfer function that is very close to the transfer function of the original Lanczos matrix. The new Lanczos matrix is then checked to assure that it is stable and passive and, if so, the transfer function corresponding to that matrix is generated and the frequency response of the transfer function is generated and displayed to the user. If this matrix also is not stable and passive, the process is repeated until a stable and passive partial Padé approximant transfer function can be generated.

In an exemplary embodiment, the processing unit 12 is a SPARC workstation, available from SUN MICROSYSTEMS, INC., having about 32 MB associated RAM memory and a hard or fixed drive memory 15. The processor 14 operates using the UNIX operating system to run application software 18 implementing the disclosed circuit analyzer 10 and method. It should be understood that the above described processor is merely exemplary and that any computer or processing system having sufficient processing capability and memory may be employed.

A description of the circuit to be analyzed is provided from a circuit characteristic data source 26 through an input device 22 to the processor 14. The data source 26 may be any source for providing information to a computer, such as a floppy disk, CD-ROM or DAT containing a circuit characteristic file. It also may be a human operator that enters the data manually. The input device 22 may be a keyboard, a floppy disk drive, a CD-ROM drive or another data reading device.

The processor 14 receives the circuit characteristic data from the circuit characteristic data source 26 through the input device 22. The received circuit characteristic data is stored in memory 16 for processing in accordance with the present invention to generate a frequency response signal representing the approximated or predicted frequency response of the circuit. The generated frequency response data of a linear subcircuit may be a sub-goal in the overall analysis of a larger, non-linear circuit. Alternately, the circuit analyzed may be an independent linear circuit.

The generated frequency response data may be converted by the processor 14 into a graphic representation for plotting the approximated frequency response in volts, amperes, or other units, as a function of frequency. The graphic representation is sent to an output device 24 such as a display for displaying the predicted frequency response of the circuit under analysis. Alternately, the output device 24 may include specialized graphics programs to convert the generated frequency response signal to a displayed graphic.

In even further possible embodiments, the generated frequency response data may include determined poles, zeroes, and/or residues listed in a file for output as columns or tables of text by the output device 24. The output device 24 may be a CRT display or a hard copy printer.

The circuit analyzer 10 performs the application programs and subroutines described hereinbelow which are implemented from compiled source code in the C++ and/or FORTRAN programming languages. The application programs and subroutines are described herein below in conjunction with FIGS. 2 and 3.

Figure 2:
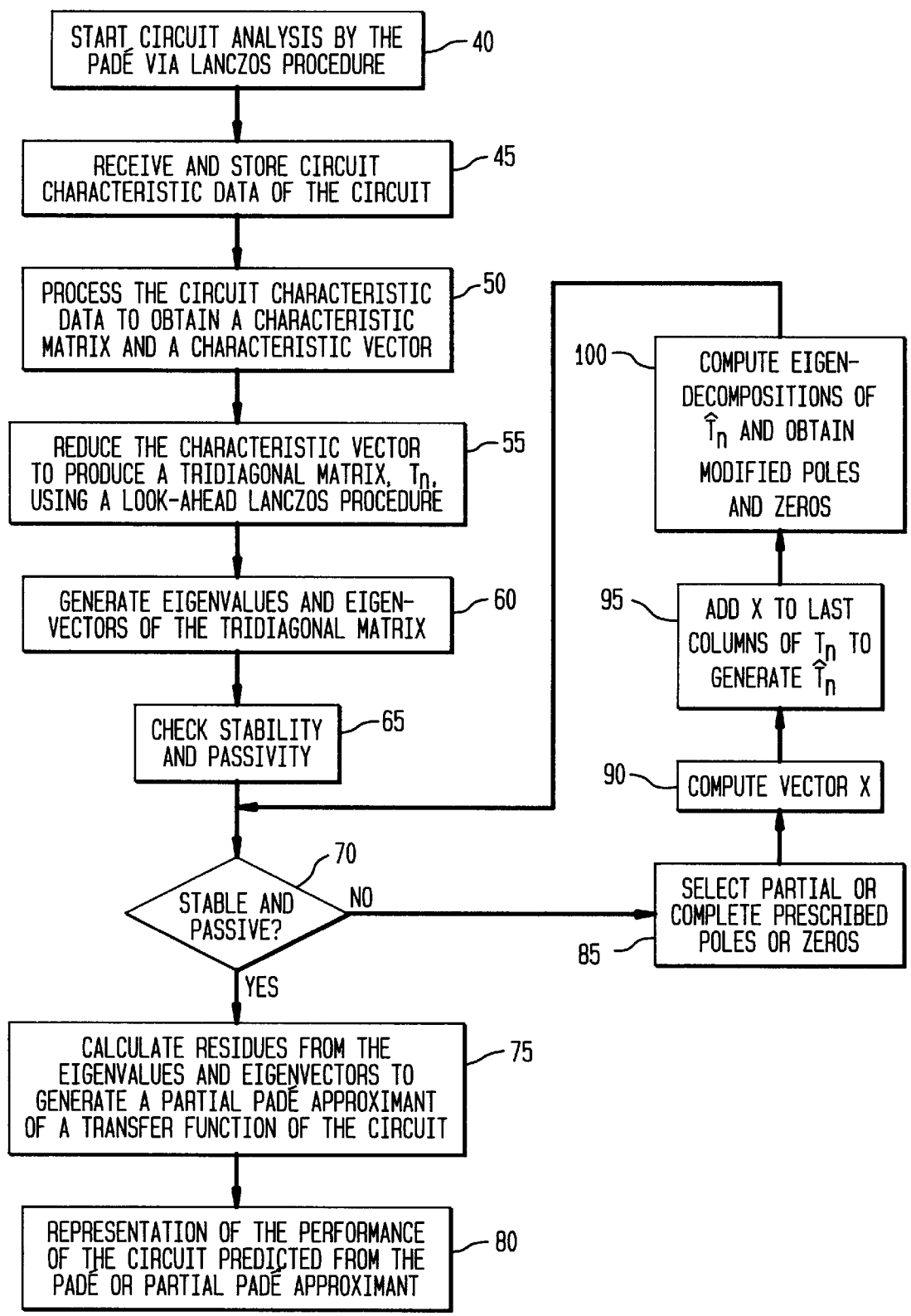
FIG. 2 is a flow chart illustrating steps for generating a Padé approximant transfer function of a linear circuit in accordance with the present invention.

Referring to FIG. 2, the circuit analyzer 10 includes software for generating a frequency response signal of a circuit. In step 40, the program is started. In step 45, the circuit characteristic data is received and stored in memory 16 for use with the program.

In step 50, the program processes the circuit characteristic data to generate a characteristic matrix and a characteristic vector that mathematically describe the circuit.

In step 55, the matrix and vector are operated upon to reduce the characteristic matrix using the matrix reduction program of the stored programs 22 to produce a block tri-diagonal matrix $T_n$ using the look-ahead Lanczos procedure. In step 60, the program computes the eigendecompositions of the Lanczos vector $T_n$ and obtains the approximate poles and zeros of the transfer function corresponding to matrix $T_n$.

In step 65, the program generates the matrix $T_n$ and the corresponding poles and zeros. In step 70, the program checks the matrix $T_n$, including the locations of it poles and zeros, to determine if the transfer function corresponding to the original Lanczos matrix $T_n$ will be passive (if the original circuit is passive) and stable. If the original circuit is not passive, then it is not necessary that the transfer function be passive, rather, it only need be stable. If so, processing flows to step 75, in which the processor calculates residues from the eigendecompositions to generate a partial Padé approximant of a transfer function of the circuit.

Finally, in step 80, the partial Padé approximant is applied to generate a graphic representation of the circuit response predicted by the approximant. The representation may be a graph of the signal (e.g., voltage or current magnitude) at a particular terminal of the circuit plotted against frequency, such as illustrated in FIGS. 4, 5, 7, and 9, to be discussed in further detail below.

If, in step 70, the matrix $T_n$ is found not to be both stable and passive (if the original circuit was passive), processing flows to step 85. In step 85, the processor selects partial or complete prescribed poles and/or zeros of $T_n$ in accordance with the present invention as described more fully below. In step 90, a vector x is computed using the partial Padé via Lanczos procedure. In step 95, the vector x is added to the last column of the matrix $T_n$ to create a matrix $\overline{T}_n$.

In step 100, the processor computes the eigendecompositions of $\overline{T}_n$ and obtains the approximate poles and zeros of the modified matrix $\overline{T}_n$. At this point, processing flows back to step 60 where it is determined if the modified matrix $\overline{T}_n$ is stable and passive. If so, processing flows through to step 75 through 80 as previously described. If not, steps 85 through 100 are repeated to generate a further $\overline{T}_n$ vector.

The details of step 55 can be found in aforementioned U.S. patent application Ser. No. 08/489,270 and is also reviewed and summarized below in the section entitled Padé Approximation and Krylov Subspaces.

Figure 3:
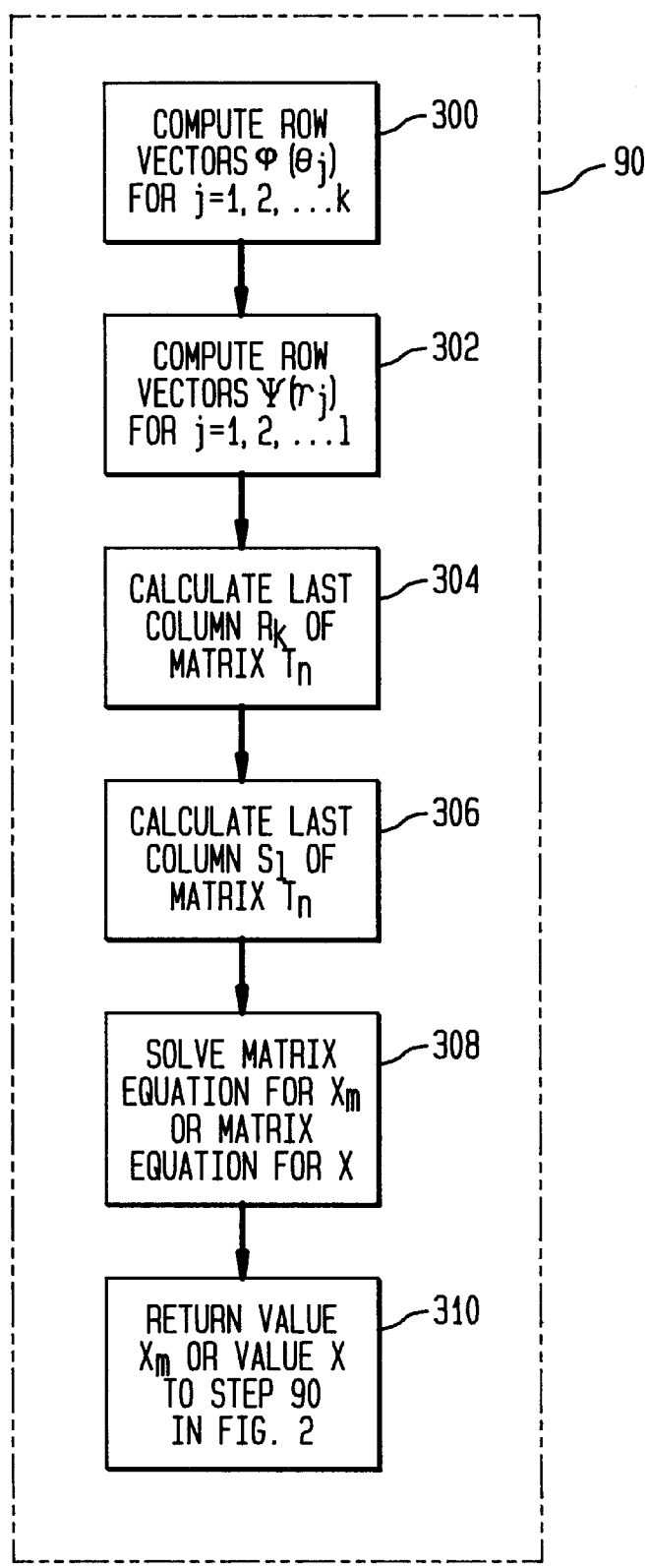
FIG. 3 is a flow chart illustrating in more detail step 95 of FIG. 2.

The details of step 90 are presented in more detail in FIG. 3.

Referring now to FIG. 3, in step 300, the row vectors $\phi(\theta_j)$ for j=1,2, . . . k are computed. In step 302, the processor computes the row vectors $\psi(\tau_j)$ for j=1,2, . . . ,l. In step 304, the processor calculates the last column $R_k$ of the k by n matrix $T_n$. In step 306, the processor calculates the last column $S_l$ of the l by (n−1) matrix $T'_n$.

In step 308, the matrix equation:

$$\begin{bmatrix} \phi_k(:, n-m+1:n) \\ \Psi_l(:, n-m:n-1) \end{bmatrix} x_m = \begin{bmatrix} R_k(:, n) \\ S_l(:, n-1) \end{bmatrix}, \text{ if } m < n.$$

is solved for $x_m$ or the equation:

$$\begin{bmatrix} \phi_k \\ \tilde{\Psi}_l \end{bmatrix} x = \begin{bmatrix} R_k(:, n) \\ S_l(:, n-1) \end{bmatrix}, \text{ if } m = n, \text{ where } \tilde{\Psi}_l = [\, 0 \quad \Psi_l \,].$$

is solved for x.

Note that X(:,j) and X(:,i:j) denote the j-th column and the i-th to the j-th columns of the matrix X, respectively.

In step 310, the value $X_n$ or x is returned and provided for step 85 of FIG. 2.

The steps in FIG. 3 are described in more detail in Section IV.

Section II below is a brief review of reduced-order modeling techniques based on Krylov subspaces. That section describes the details of steps 50, 55 and 60 in FIG. 2. For an even more detailed discussion of Krylov subspace-based reduced-order modeling and steps 50, 55 and 60, reference should be made to our aforementioned prior U.S. patent application Ser. No. 08/489,270.

II. Krylov's Subspaced-based Reduced-order Modeling

A. Circuit Transfer Functions

A lumped, linear(ized), time-invariant circuit can be described by the following system of first-order algebraic differential equations:

$$C\,\dot{x}(t) = -Gx(t) + bu(t),$$

$$y(t) = c^T x(t). \quad \text{(Eq. 1)}$$

Here, C and G are N×N matrices and represent the contributions of memory elements (such as capacitors and inductors) and memoryless elements (such as resistors), respectively, and x(t) is a N-dimensional state vector representing the circuit variables. The functions u(t) and y(t) represent the excitation and the output of interest, respectively. By applying the Laplace transform to the system (1), assuming zero initial condition, we obtain $$sCX(s) = -GX(s) + bU(s),$$

$$Y(s) = c^T X(s)$$

Here X(s), U(s) and Y(s) denote the Laplace transforms of x(t), u(t) and y(t), respectively. It follows that the input U(s) and output Y(s) are related by the transfer function $$H(s) = c^T (G + sC)^{-1} b \quad \text{(Eq. 2)}$$

Let $s_0 \in \mathbb{R}$ be a real expansion points such that the matrix $G + s_0 C$ is nonsingular. Using any factorization of $G + s_0 C$ of the form $$G + s_0 C = L \cdot U^{-1}, \quad U \in \mathbb{R}^{N \times N}, \quad \text{(Eq. 3)}$$

we now rewrite the transfer function H(s) as follows:

$$H(s) = 1^T (I - (s - s_0)A)^{-1} r \quad \text{(Eq. 4)}$$

where $$A := -L^{-1}CU^{-1}, \; r := L^{-1}b \; 1 := U^{-T}c.$$

For example, in (Eq. 3), we can choose an LU factorization of $G+s_0C$, or even the trivial factorization $L=G+s_0C$ and $U=I$.

By expanding the transfer function (Eq. 4) about $s_0$ and setting $\sigma = s - s_0$, we obtain the representation $$H(s_0 + \sigma) = \sum_{j=0}^{\infty} m_j \sigma^j, \text{ where } m_j = l^T A^j r \text{ for all } j. \tag{Eq. 5}$$

B. Padé Approximation and Krylov Subspaces

Note that H is a rational function. In general, H is of type (N−1,N), i.e., its numerator and denominator polynomials are of degree N−1 and N, respectively. This suggests basing reduced-order modeling on approximate transfer functions $H_n$ of the form $$H(s_0 + \sigma) = \frac{\psi_{n-1}(\sigma)}{\varphi_n(\sigma)}, \tag{Eq. 6}$$

where $\psi_{n-1}$ and $\phi_b$ are polynomials of degree at most n−1 and n, respectively, and n<<N. The function (Eq. 6) is called an n-th Padé approximant if the polynomials $\psi_{n-1}$ and $\phi_n$ are chosen such that the expansion of $H_n$ about $s_0$ agrees with (Eq. 5) in its first 2n terms, i.e., $$H(s_0+\sigma) = H_n(s_0+\sigma) + O(\sigma^{2n}), \tag{Eq. 7}$$

Fortunately, the explicit use of moments can be avoided by computing $H_n$ by means of suitable basis vectors for the Krylov subspaces $$K_n(A,r) = \text{span}\{r, Ar, A^2r, \ldots, A^{N-1}r\}$$

and $$K_n(A^T, l) = \text{span}\{l, A^{T1}, ^2l, \ldots, (A^T)^{n-1}l\} \tag{Eq. 8}$$

More precisely, one generates two sequences of vectors $$\{j_h\}_{j=1}^n \text{ and } \{w_j\}_{j=1}^n \tag{Eq. 9}$$

such that $$\text{span}\{v_1, v_2, \ldots, v_n\} = K_n(A, r)$$

and $$\text{span}\{w_1, w_2, \ldots, w_n\} = K-n(A^T, l). \tag{Eq. 10}$$

Note that $$m_{2j} = l^T A^{2j} r = ((A^T)^j l)^T (A^j r)$$

and $$m_{2j-1} = l^T A^{2j+1} r = ((A^T)^j l)^T A(A^j r). \tag{Eq. 11}$$

By (Eq. 11) and (Eq. 10), the information contained in the moments $m_0, m_1, \ldots, m_{2n-1}$ is also contained in the quantities $$w_j^T v_j \text{ and } w_j^T A v_j, \; j=1,2,\ldots,n. \tag{Eq. 12}$$

Hence, the point of using the basis vectors (Eq. 10) is that they allow one to obtain all necessary "moment information" for constructing $H_n$ from (Eq. 12), without ever explicitly forming the moments.

C. The Lanczos-Based Approach

The Lanczos process constructs the basis vectors (Eq. 9) so that they are biorthogonal, i.e., $$w_j^T v_k = 0 \text{ for all } j \neq k, \; j,k=1,2,\ldots,n. \tag{Eq. 13}$$

This can be done by means of simple three-term recurrences. The coefficients of these recurrences form a tri-diagonal matrix $T_n$ from which one can directly obtain the n-th Padé approximant $H_n$. More precisely, we have $$H_n(s_0+\sigma) = (l^T r) e_1^T (I - \sigma T_n)^{-1} e_1 \tag{Eq. 14}$$

The use of the Lanczos process to compute $H_n$ can also be expressed in terms of the vectors (Eq. 9). Let $$v_n = [v_1 \; v_2 \; \ldots \; v_n] \text{ and } W_n = [w_1 \; w_2 \; \ldots \; w_n] \tag{Eq. 15}$$

denote the N×n matrices whose columns are just the vectors (Eq. 9). Then, the matrix $T_n$ is given by $$T_n = (W_n^T V_n)^{-1} W_n^T A \; V_n. \tag{Eq. 16}$$

Note that, by (Eq. 13) and (Eq. 15), the matrix $W_n^T V_n$ in (16) is diagonal.

III. Partial Padé Approximation

Turning now to the key of the present invention, let $H_n(s)$ be an (n−1, n) Padé approximation to the original transfer function H(s), matching the maximal number of moments: 2n. The partial Padé approximation, proposed in C. Brezinski, Partial Padé Approximation, J. Approx. Theory, vol. 54, pp. 210–233, 1988 (hereinafter Brezinski), is a function of the same form, $$\hat{H}_n(s_0 + \sigma) = (l^T r) \frac{\hat{\psi}_{n-1}(\sigma)}{\hat{\varphi}_n(\sigma)}, \tag{Eq. 23}$$

where some of the poles and zeros are prescribed. As in the classical Padé approximation, the rational function should maximize the number of matched coefficients in a Taylor expansion about $s_0$. Here the numerator polynomial $\psi_{n-1}$ is of degree n−1 with l prescribed roots and denominator polynomial $\phi^n$ degree n with k prescribed roots. The remaining degrees of freedom, 2n-l-k, could be used to ensure the matching of an equal number of Taylor coefficients, i.e., $$H(s_0+\sigma) = \hat{H}_n(s_0+\sigma) + O(\sigma^{2n-l-k}) \tag{Eq. 24}$$

In Brezinski, the Taylor expansion of the function to be approximated is explicitly applied to construct a partial Padé approximation. The more restricted problem of prescribing just some of the poles in Padé approximations is widely studied in literature. The common terminology used is Padé-type approximations.

It has been shown that the Padé approximation $H_n(s)$ of an RLC circuit transfer function will occasionally be unstable and/or non-passive despite the fact that RLC circuits are always stable and passive. The instability or the non-passivity of the transfer function H(n) is, in general, caused by a small number of misplaced poles and zeros. The effects of these poles and zeros on the approximate transfer function in the domain of interest must be minimal, once the accuracy of the Padé approximation becomes satisfactory.

We propose using the partial Padé approximation to generate stable and/or passive reduced-order models of circuit transfer functions through post-processing of the Padé approximation originally computed with the PVL algorithm.

Our method comprises: (1) computation of the Padé approximation of the transfer function via a Lanczos process (the PVL algorithm), (2) identification of the misplaced poles and/or zeros that are responsible for the instability or the non-passivity of the reduced-order model, if any, (3) prescription of alternative locations for these poles and/or zeros, (4) computation of the corresponding partial Padé approximation using a novel algorithm, and (5) a check of the stability and/or passivity of the result using the eigenvalue based criterion described in Z. Bai and R. W. Freund "An Eigenvalue-Based Test for Positive Realness of Transfer Functions," Numerical Analysis Manuscript, Bell Laboratories, Murray Hill, N.J. (Appendix A attached hereto). Since we argue that the effect of these poles and zeros on the transfer function in the domain of interest must be small, we expect little or no perturbation to the already converged poles and/or zeros.

Below, we propose a novel method for computing a partial Padé approximation and also demonstrate via numerical experiments its usefulness for enforcing stability and passivity in reduced-order models. The significant novelty in our approach for constructing a partial Padé approximation comprises the use of a matrix update technique on the tridiagonal matrix obtained by a Lanczos process instead of using moments explicitly as proposed by Brezinski. The resulting partial Padé approximation obtained via the Lanczos process and post-processing, which we coin PVLπ, is significantly superior in terms of both numerical stability and computational efficiency.

IV. Post Processing of PVL: The PVLπ Algorithm

As remarked in the previous section, instead of using moments explicitly for the computation of the partial Padé approximation, we prefer to post-process the matrix $T_n$ generated by the PVL algorithm. The partial Padé approximation problem is therefore recast as the problem of finding an updating matrix $F_n$ such that some of the eigenvalues of the matrices $\hat{T}_n = T_n + F_n$ and $\hat{T}'_n = T'_n + F'_n$ are the prescribed values. Here, for any given matrix X, X' denotes the matrix obtained by deleting the first row and column of X. Recall that the zeros of the reduced-order transfer function $H_n$ are given by the eigenvalues of $T'_n$. For a properly chosen updating matrix $F_n$, we will have modified reduced-order transfer function associated with the updated matrix $T_n$ such that $$\hat{H}_n(s_0+\sigma) = (l^T r) e_1^T (I - \sigma \hat{T}_n)^{-1} e_1 = H(s_0+\sigma) + O(\sigma^{2n-l-k}) \quad \text{(Eq. 25)}$$

Using the formulation of the Lanczos process in terms of polynomials instead of vectors, it can be shown that the updating matrix $F_n$ must be a rank-one matrix of the form $$F_n = x e_n^T$$

Furthermore, if there are a total of m prescribed poles and zeros, where $m = k + l \leq n$, then the vector x can be chosen as $$x = \begin{bmatrix} 0 \\ x_m \end{bmatrix}.$$

To verify the order of approximation of the modified reduced-order transfer function defined by $\hat{T}_n = T_n + x e_n^T$ by the Sherman-Morrison formula, we have $$e_n^T (I - \sigma \hat{T}_n)^{-1} = e_1^T (I - \sigma T_n)^{-1} e_1 - \tau \sigma e_1^T (I - \sigma T_n)^{-1} x e_n^T (I - \sigma T_n)^{-1} e_1$$

Here, the scalar, τ, is given by $\tau^{-1} = 1 - \sigma e_n^T (I - \sigma T_n)^{-1} x$. By using the formula $$(I - \sigma T_n)^{-1} = \frac{\operatorname{adj}(I - \sigma T_n)}{\det(I - \sigma T_n)}$$

where adj $(I-\sigma T_n)$ stands for the adjoint matrix made up of $(n-1)\times(n-1)$ cofactors of $I-\sigma T_n$, one can verify that $$e_n^T (I - \sigma T_n) = O(\sigma^{n-1})$$

and $$e_1^T (I - \sigma \hat{T}_n)^{-1} \begin{bmatrix} 0 \\ x_m \end{bmatrix} = O(\sigma^{n-m}).$$

Therefore, the modified reduced-order transfer function defined by (Eq. 25) has the approximation order 2n-k-l, as defined in (Eq. 24). One also can verify directly by straightforward calculation that $$l^T A^j r = (l^T r) e_1^T T_n^j e_1 = (l^T r) e_1^T \hat{T}_n^j e_1$$

for $j = 0, 1, 2, \ldots, 2n-m-1$. This again justifies that the modified reduce-order transfer function $\hat{H}_n(s_0+\sigma)$ is a partial Padé approximation to the original transfer function $H(s_0+\sigma)$.

The following algorithm computes the desired vector x and corresponds to the algorithm outlined in the flowchart of FIG. 3.

Algorithm 1 (Computation of the vector x)

INPUT:

$\{\theta_j\}_{j=1}^k$ and $\{\tau_j\}_{j=1}^l$, where $m = k + l \leq n$.

OUTPUT: Vector x such that the matrices $\hat{T}_n = T_n + x e_n^T$ and $\hat{T}'_n = T'_n + x' e_{n-1}^T$ have the prescribed eigenvalues $\{\theta_j\}_{j=1}^k$ and $\{\tau_j\}_{j=1}^l$, respectively.

1) Compute the row vector $\phi(\theta_j)$ for $j = 1, 2, \ldots, k$: if $\theta_j \in \lambda(T_n)$, then $\phi(\theta_j)$ is the corresponding left eigenvector, else $\phi(\theta_j) = e_n^T (\tau_j I - T_n)^{-1}$.

2) Compute the row vector $\psi(\tau_j)$ for $j = 1, 2, \ldots, l$: if $\tau_j \in \lambda(T'_n)$, then $\psi(\tau_j)$ is the corresponding left eigenvector, else $\psi(\tau_j) = e_{n-1}^T (\theta_j I - T'_n)^{-1}$.

3) Compute the last column $R_k(:,n)$ of the k×n matrix $$R_k = \Lambda_k \Phi_k - \Phi_k T_n := \operatorname{diag}(\theta_j) [\varphi(\theta_j)] - [\varphi(\theta_j)] T_n.$$

4) Compute the last column $S_l(:,n-1)$ of the l×(n-1) matrix $$S_l = Y_l \Psi_l - \Psi_l T'_n = \operatorname{diag}(\tau_j) [\psi(\tau_j)] - [\psi(\tau_j)] T'_n.$$

5) Solve for $x_m$:

$$\begin{bmatrix} \phi_k(:, n-m+1:n) \\ \Psi_l(:, n-m:n-1) \end{bmatrix} x_m = \begin{bmatrix} R_k(:, n) \\ S_l(:, n-1) \end{bmatrix}, \text{ if } m < n.$$

Or solve for x:

$$\begin{bmatrix} \phi_k \\ \Psi_l \end{bmatrix} x = \begin{bmatrix} R_k(:,n) \\ S_l(:,n-1) \end{bmatrix}, \text{ if } m = n, \text{ where } \check{\Psi}_l = [\,0 \;\; \Psi_l\,].$$

Note that X(:,j) and X(:,i:j) denote the j-th column and the i-th to the j-th columns of the matrix X, respectively. Moreover, λ(X) denotes the set of eigenvalues of X. If all matrices and vectors are real, and the prescribed complex eigenvalues $\theta_j$ and/or $\tau_j$ occur in complex conjugate pairs, if any, then the above algorithm can be modified slightly such that the vector x (and therefore the modified matrix $\check{T}_n$) stays real.

Two special assignments of poles and zeros are of particular interest. The first case is when all poles are prescribed, i.e., k=n. Then we have $$\Phi_n x e_n^T = R_n,$$

where $\Phi_n$ is an n×n matrix. If $\Phi_n$ is nonsingular, then the vector x is given by $$x = \Phi_n^{-1} R_n(:,n).$$

In this case, all eigenvalues of the matrix $$\hat{T}_n = T_n + x e_n^T$$

are the prescribed values, which implies that all poles of the modified reduced-order transfer function defined by $T_n$ are the prescribed values. Let $p_j = s_0 + 1/\lambda_j$ for j=1, ... n be the poles of the reduced-order model. Without loss of generality, assume that all poles are stable, except the last two poles $p_{n-1}$ and $p_n$, which are unstable. Let $\theta_j = 1/(p_j - s_0)$ for j=1,2, ... ,n−2. Let the unstable poles $p_{n-1}$, and $p_n$ be assigned to the stable poles $$\hat{p}_{n-1} \text{ and } \hat{p}_n,$$

and let $$\theta_{n-1} = 1/(\hat{p}_{n-1} - s_0) \text{ and } \theta_n = 1/(\hat{p}_n - s_0).$$

Then with all these prescribed poles, the modified reduced-order transfer function $\hat{H}_n(s_0 + \sigma)$ is guaranteed to be stable.

The second special case is when all zeros are prescribed. In this case $$\Psi_{n-1} x' e_{n-1}^T = S_{n-1},$$

where $\Psi_{n-1}$ is an (n−1)×(n−1) matrix. If it is nonsingular, then we have $$x' = \Psi_{n-1}^{-1} S_{n-1}(:,n-1).$$

As a result, all eigenvalues of the matrix $$\hat{T}'_n = T'_n + x' e_{n-1}^T$$

are the prescribed values, which means that all zeros of the modified reduced-order transfer function defined by $$\hat{T}_n$$

are the prescribed values. With a similar discussion as for assigning poles, it can be guaranteed that the modified reduced-order model has no zeros in the right half-plane.

With the above algorithm to update partial or complete poles and/or zeros of the reduced-order transfer function, we are ready to present a new algorithm, which generates a partial Padé approximation via the Lanczos process. The new algorithm is based on the PVL algorithm and does post-processing in the presence of unstable poles and right-half-plane zeros of the reduced-order transfer function. The resulting computational procedure is herein coined the PVLπ algorithm. Algorithm 2 below corresponds to the algorithm outlined in the flowchart of FIG. 2.

Algorithm 2 (Sketch of the PVLπ algorithm)

1) Run n steps of the Lanczos process to obtain the tridiagonal matrix $T_n$. This step corresponds to step 55 in FIG. 2.

2) Compute eigendecompositions of $T_n = S_n \text{diag}(\lambda_j) S_n^{-1}$ and $T'_n \text{diag}(\lambda'_j) (S'_n)^{-1}$ and obtain the approximate poles and zeros $$p_j = s_0 + 1/\lambda_j \text{ and } z_j = s_0 + 1/\lambda'_j,$$

respectively. This step corresponds to step 60 in FIG. 2.

3) Check stability and/or passivity. If the reduced-order model defined by $T_n$ is stable and/or passive, then set $$\hat{T}_n = T_n$$

and go to Step 8).

4) Select partial or complete prescribed poles $$\hat{p}_j \text{ and/or zeroes } \hat{z}_j.$$

Set $$\theta_j = 1/(\hat{p}_j - s_0) \text{ and } \tau_j = 1/(\hat{z}_j - s_0).$$

This step corresponds to step 85 in FIG. 2.

5) Use Algorithm 1 to compute the vector x. This step corresponds to step 90 in FIG. 2.

6) Compute eigendecompositions of $$\hat{T}_n = T_n + x e_n^T = \hat{S}_n \text{diag}(\hat{\lambda}_j) \hat{S}_n^{-1}$$

and $$\hat{T}'_n = T'_n + x' e_{n-1}^T = \hat{S}'_n \text{diag}(\hat{\lambda}'_j)(\hat{S}'_n)^{-1}$$

and obtain the modified approximate poles and zeros $$\hat{p}_j = s_0 + 1/\hat{\lambda}_j \text{ and } \hat{z}_j = s_0 + 1/\hat{\lambda}'_j.$$

This step corresponds to step 100 in FIG. 2.

7) Check stability and/or passivity. Go to Step 4) if necessary.

8) Compute the poles (zeros) and residues of the modified reduced order model $$\hat{H}_n(s_0 + \sigma) = (1^T r) e_1^T (I - \sigma \hat{T}_n)^{-1} e_1.$$

This step corresponds to step 75 in FIG. 2.

Recall from Section 2 that all zeros being in the left half-plane is only a necessary condition for passivity, and that an additional positivity condition needs to be checked. In Algorithm 2, the "passivity check" refers to this necessary condition only.

V. EXAMPLES

In this section, we present two circuit examples to demonstrate the effectiveness of the PVLπ method.

A. The PEEC Circuit

Figure 4:
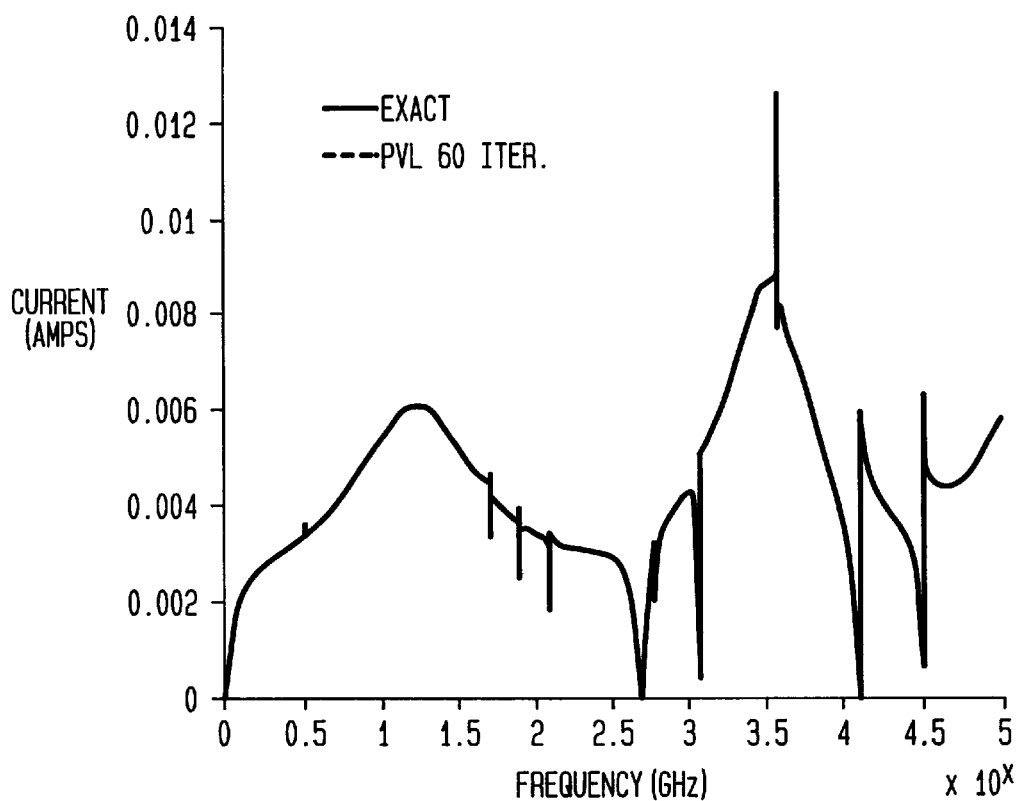
FIG. 4 is a diagram of the actual frequency response and the corresponding original Padé approximant frequency response of a first exemplary circuit.

Our first example is a circuit resulting from the PEEC (partial element equivalent circuit) discretization of an electromagnetic problem. This circuit has been used often as a test problem in the model-reduction literature. The circuit consists of only inductors, capacitors, and inductive couplings, and it is driven by a finite resistance source. We are interested in analyzing the response of this circuit, in this case the current flowing through one of the inductors. The circuit being mainly LC, its poles would lie exactly on the imaginary axis in the absence of the 100Ω source resistance. The source resistance causes the poles to move into the left half of the complex plane, but leaves most of them in the proximity of the imaginary axis. Due to this proximity, during the computation of a reduced-order model, numerical and approximation errors can easily produce unstable poles, i.e., poles lying in the right half of the complex plane. Indeed, running the PVL algorithm (with shift $s_0 - 2\pi 10^9$) for $n=60$ iterations produces an almost exact transfer function in the 0–5 GHz range, as shown in FIG. 4, but results in 8 unstable poles and 7 nearly stable poles, see FIG. 6.

Figure 5:
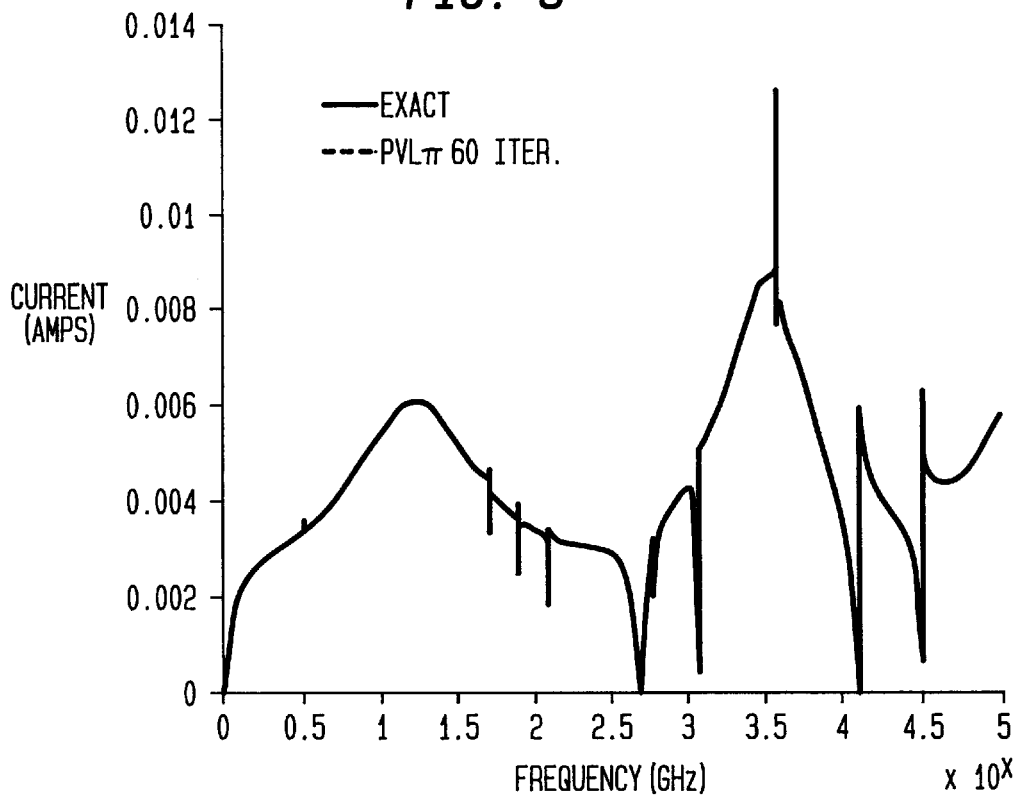
FIG. 5 is a diagram of the actual frequency response and the corresponding partial Padé approximant frequency response in accordance with the present invention of the first exemplary circuit.
Figure 6:
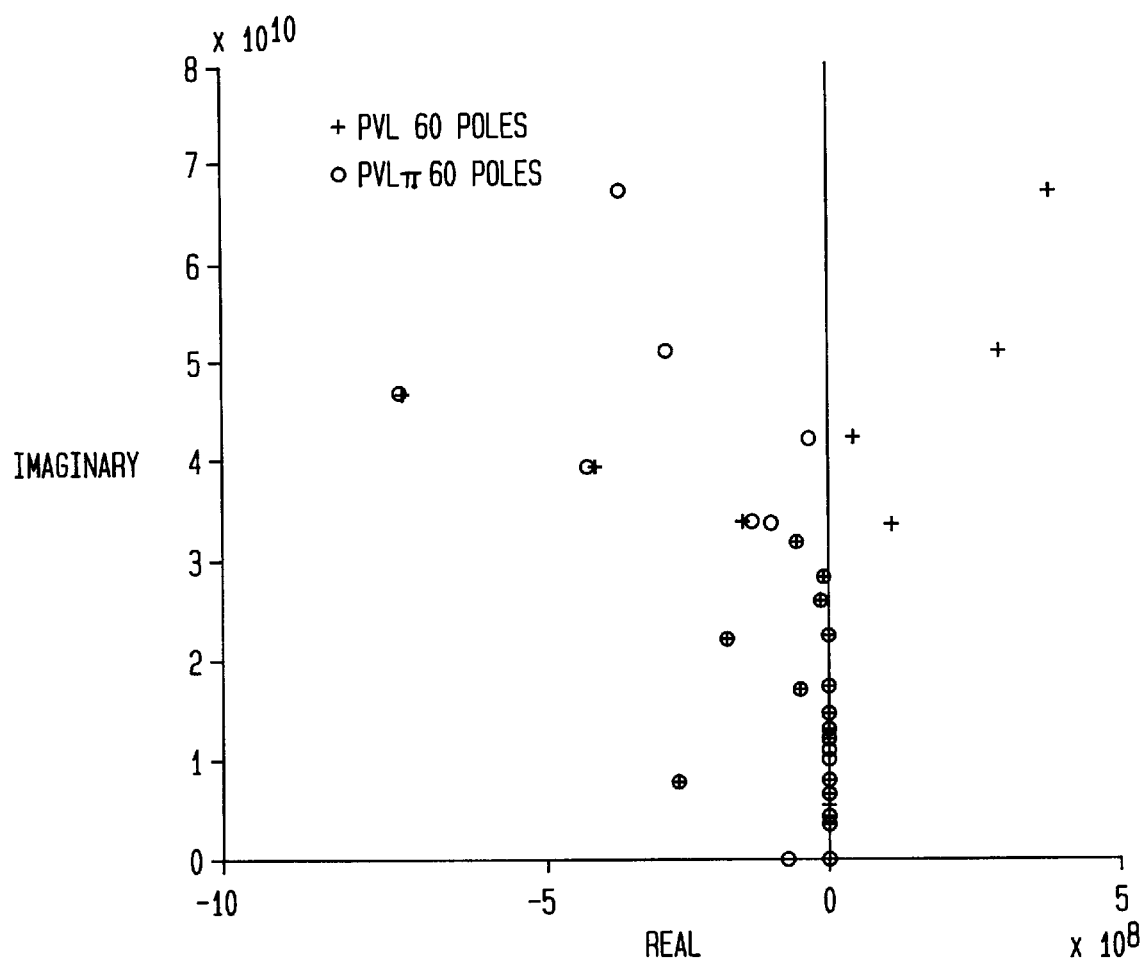
FIG. 6 is a diagram illustrating the poles of the first exemplary circuit both as determined based upon the original Padé approximant and based upon the partial Padé approximant in accordance with the present invention.

In order to produce a stable reduced-order model, we use PVLπ to force all 15 unstable poles, $p_j = \text{Re}(p_j) + i\,\text{IM}(p_j)$, into the left half-plane. This is done by setting, in Algorithm 1, $$\theta_j = \frac{1}{\hat{p}_j - s_0}, \text{ where } \hat{p}_j = -\text{Re}(p_j) + i\text{Im}(p_j),$$

for all 15 unstable poles, while the stable poles are unchanged. FIG. 6 shows the poles of the reduced-order transfer function $H_{60}(i\omega)$ produced by the PVL algorithm, and the modified reduced-order transfer function $$\hat{H}_{60}(i\omega)$$

generated by the PVLπ algorithm. The modified, reduced-order transfer function $$\hat{H}_{60}(s)$$

has all its poles in the left half plane and is stable. FIG. 5 shows the frequency responses of the exact transfer function $$\hat{H}_{60}(i\omega)$$

compared to $$\hat{H}(i\omega)$$

produced by the PVLπ algorithm with 60 iterations, in the 0–5 GHz range. The match remains as good as before.

B. A Package Model

The next application is the analysis of a 64-pin package model used for an RF integrated circuit. Only eight of the package pins carry signal, the rest being either unused or carrying supply voltages. The package model is described by approximately 4000 circuit elements, resistors, capacitors, inductors, and inductive couplings. The size of the nodal circuit matrices for the package is about 2000. Here, we compute the input impedance of one of the pins. After executing the PVL algorithm for $n=80$ iterations, the resulting reduced-order model has a transfer function $H_{80}$ defined by $T_{80}$. The approximation $H_{80}$ is sufficiently accurate up to 10 GHz, but has 2 poles and 4 zeros violating stability and passivity conditions.

Figure 7:
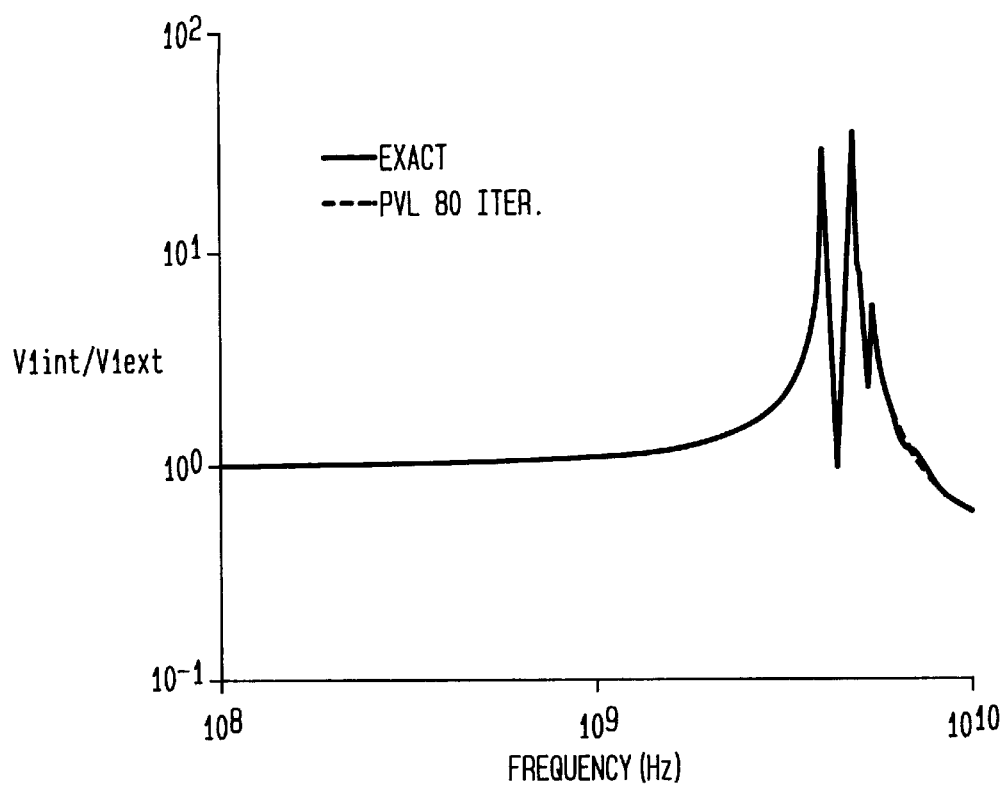
FIG. 7 is a diagram of the actual frequency response and the corresponding original Padé approximant frequency response of a second exemplary circuit.
Figure 8:
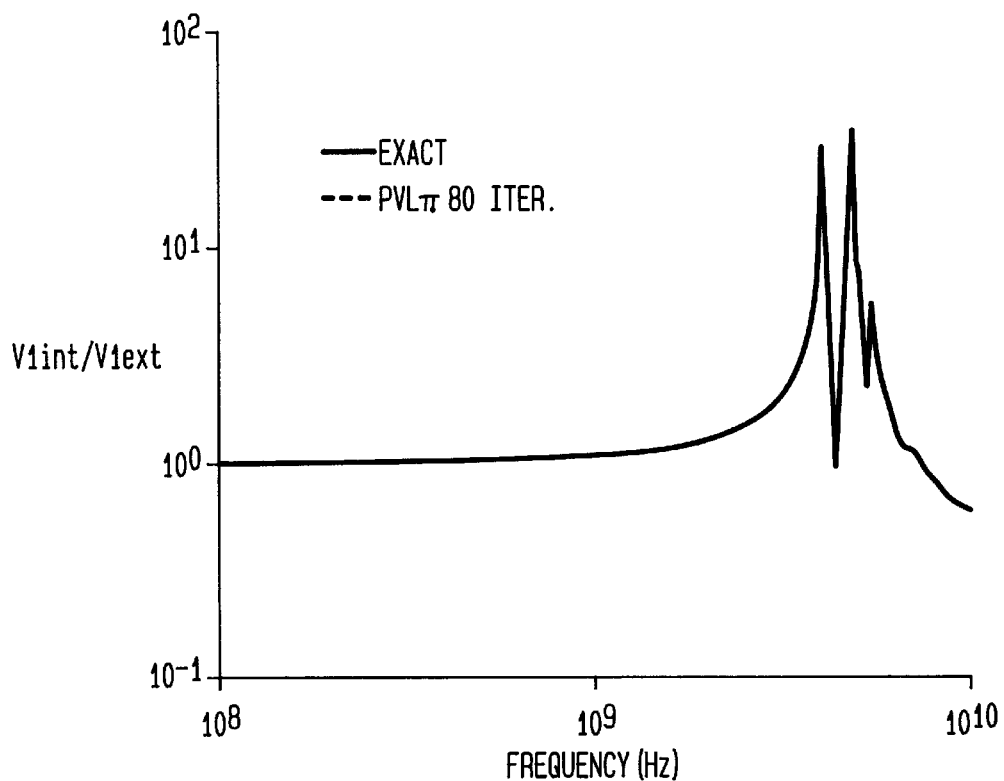
FIG. 8 is a diagram of the actual frequency response and the corresponding partial Padé approximant frequency response in accordance with the present invention of the second exemplary circuit.

We use PVLπ to force the 2 unstable poles, $p_j = \text{Re}(p_j) + i\,\text{Im}(p_j)$, and the 4 unstable zeros $z_j = \text{Re}(z_j) + i\text{Im}(z_j)$ into the left half-plane. This is done by setting, in Algorithm 1, $$\theta_j = \frac{1}{\hat{p}_j - s_0}, \text{ where } \hat{p}_j = -0.1\text{Re}(p_j) + i(10\text{Im}(p_j)),$$

for the 2 unstable poles, and $$\tau_j = \frac{1}{\hat{z}_j - s_0}, \text{ where } \hat{z}_j = -0.1\text{Re}(z_j) + i(10\text{Im}(z_j)),$$

for the 4 unstable zeros. The reduced-order model produced by the PVLπ has all poles and zeros of the modified reduced order transfer function given by $$\hat{T}_{80} = T_{80} + xe^T$$

in the left complex half-plane, where the vector x has only $2+4=6$ non-zero entries at the bottom. By construction, the modified, reduced-order model is stable, and it also satisfies the necessary condition that a passive system cannot have zeros in the right half-plane. To verify passivity, an additional positivity condition has to be satisfied; see, e.g. B. D. O. Anderson and S. Vongpanitlerd, "Network Analysis and Synthesis," Englewood Cliffs, N.J.: Prentice-Hall, 1973. In Z. Bai and R. W. Freund, "An Eigenvalue-Based Test for Positive Realness of Transfer Functions," Numerical Analysis Manuscript, Bell Laboratories, Murray Hill, N.J. (Appendix A attached hereto), we derived a simple eigenvalue-based test for this positivity condition. Using this test, one easily verifies that the reduced-order model is indeed passive. FIG. 7 shows the frequency response of the exact transfer function and the reduced-order transfer function generated by the PVL algorithm. FIG. 7 shows the frequency response of the exact transfer function and the reduced-order transfer function generated by the PVLπ algorithm. FIGS. 7 and 8 clearly illustrate that no accuracy has been lost by enforcing stability and passivity by means of our post-processing procedure.

We term the method and apparatus of the present invention partial Padé via Lanczos modeling, or PVL π for short. The scalar method and apparatus disclosed herein should be extensible to matrix Padé approximants. Several algorithms for checking the stability and passivity of the original Lanczos matrix $T_n$ are known. One particularly elegant solution is found in appendix A hereto which is a paper entitled "Eigenvalue-Based Characterization and Test for Positive Realness of Transfer Functions" by Zhaojoun Bai and Roland Freund.

Having thus described a particular embodiment of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

We claim:

1. An apparatus for generating a frequency response signal of a circuit, comprising:
   a processing unit having:
   a first program for generating, from circuit characteristic data, a block tridiagonal matrix relating to said circuit characteristic data;
   a second program for determining if said block tridiagonal matrix is stable and passive;

a third program for modifying said block tridiagonal matrix to make it stable and passive, if said block tridiagonal matrix is not stable and passive;

a fourth program for generating a frequency response signal as a function of said stable and passive block tridiagonal matrix or modified block tridiagonal matrix; and an output device for displaying said circuit frequency response signal.

2. An apparatus as set forth in claim 1 wherein said second program comprises a program for generating eigenvalues and eigenvectors of said tridiagonal matrix.

3. An apparatus as set forth in claim 2 wherein said third program comprises a program for determining a vector that can be added to a last column of said tridiagonal matrix that will make said matrix passive and stable and adds said vector to said last column to generate said modified block tridiagonal matrix.

4. An apparatus as set forth in claim 3 wherein said third program further comprises a program for determining eigenvalues and eigenvectors of said modified block tridiagonal matrix and determining if said modified block tridiagonal matrix is passive and stable.

5. An apparatus as set forth in claim 4 further comprising a program for running said third program repeatedly to further modify said modified block tridiagonal matrix, if said modified block tridiagonal matrix is not passive and stable.

6. An apparatus as set forth in claim 5 wherein said fourth program determines a transfer function of said block tridiagonal matrix or modified block tridiagonal matrix by calculating poles, zeros and residues from said eigenvalues and eigenvectors to generate a Padé approximant of a transfer function of said circuit.

7. An apparatus as set forth in claim 6 wherein said first program comprises a program for processing said circuit characteristic data to obtain a characteristic matrix and a characteristic vector of said circuit, and reducing the characteristic matrix to produce said block tridiagonal matrix by a look-ahead Lanczos procedure.

8. An apparatus as set forth in claim 1 wherein said third program comprises:

a program for computing a Padé approximation of a transfer function of said block tridiagonal matrix;

a program for identifying any misplaced poles and zeros that contribute to a lack of stability or passivity of said block tridiagonal matrix;

a program for prescribing alternative locations for said identified poles and zeros;

a program for computing a partial Padé approximation of a transfer function of said block tridiagonal matrix; and a program for checking stability and passivity of said partial Padé approximation.

9. An apparatus as set forth in claim 8 wherein said third program further comprises a program for repeating said identifying, prescribing, computing and checking programs of claim 8 upon said modified block tridiagonal matrix to further modify it, if said partial Pad6 approximation is not passive and stable.

10. An apparatus as set forth in claim 1 wherein said third program comprises:

a program for computing a row vector $\phi(\theta_j)$ for $j=1,2,\ldots,k$;

a program for computing a row vector $\psi(\tau_j)$ for $j=1,2,\ldots,l$ a program for computing a last column $R_k(:,n)$ of a matrix:

$$R_k = \Lambda_k \Phi_k - \Phi_k T_n := \text{diag}(\theta_j)[\varphi(\theta_j)] - [\varphi(\theta_j)]T_n.$$

a program for computing a last column $Sl(:,n-1)$ of a matrix:

$$S_l = Y_l \Psi_l - \Psi_l T'_n := \text{diag}(\tau_j)[\psi(\tau_j)] - [\psi(\tau_j)]T'_n; \text{ and}$$

a program for solving for $x_m$ the equation $$\begin{bmatrix} \phi_k(:,n-m+1:n) \\ \Psi_l(:,n-m:n-1) \end{bmatrix} x_m = \begin{bmatrix} R_k(:,n) \\ S_l(:,n-1) \end{bmatrix}, \text{ if } m < n.$$

or solving for x:

$$\begin{bmatrix} \phi_k \\ \tilde{\Psi}_l \end{bmatrix} x = \begin{bmatrix} R_k(:,n) \\ S_l(:,n-1) \end{bmatrix}, \text{ if } m = n, \text{ where } \tilde{\Psi}_l = [\,0 \;\; \Psi_l\,].$$

11. An apparatus as set forth in claim 10 wherein said second program comprises:

a program for computing eigendecompositions of $T_n = S_n \text{diag }(\lambda_j) S^{-1}_n$ and $T'_n \text{diag}(\lambda'_j) (S'_n)^{-1}$ and obtaining approximate poles and zeros $$p_j = s_0 + 1/\lambda_j \text{ and } z_j = s_0 + 1/\lambda'_j,$$

respectively; and a program for checking stability and/or passivity. If the reduced-order model defined by $T_n$ is stable and/or passive.

12. An apparatus as set forth in claim 11 wherein said third program comprises:

a program for computing eigendecompositions of $$\hat{T}_n = T_n + x e_n^T = \hat{S}_n \text{diag}(\hat{\lambda}_j) \hat{S}_n^{-1}$$

and $$\hat{T}'_n = T'_n + x' e_{n-1}^T = \hat{S}'_n \text{diag}(\hat{\lambda}'_j)(\hat{S}'_n)^{-1}$$

and obtaining the modified approximate poles and zeros $$\hat{p}_j = s_0 + 1/\hat{\lambda}_j \text{ and } \hat{z}_j = s_0 + 1/\hat{\lambda}'_j.$$

a program for checking stability and passivity; and a program for computing the poles and zeros and residues of the modified reduced order model $$\hat{H}_n(s_0 + \sigma) = (l^T r) e_l^T (I - \sigma \hat{T}_n)^{-1} e_l.$$

13. An apparatus for generating a frequency response signal indicative of a frequency response of a circuit, the apparatus comprising:

a data source providing circuit characteristic data representing the circuit; and a processing unit having:

a memory for receiving and storing the circuit characteristic data from the data source;

a first program for 'generating', from circuit characteristic data, a block tridiagonal matrix relating to said circuit characteristic data;

a second program for determining if said block tridiagonal matrix is stable and passive;

a third program for modifying said block tridiagonal matrix to make it stable and passive, if said block tridiagonal matrix is not stable and passive; and a fourth program for generating a frequency response signal as a function of said stable and passive block tridiagonal matrix or said modified block tridiagonal matrix.

14. An apparatus as set forth in claim 13 wherein said second program comprises a program for generating eigenvalues and eigenvectors of said tridiagonal matrix.

15. An apparatus as set forth in claim 14 wherein said third program comprises a program for determining a vector that can be added to a last column of said tridiagonal matrix that will make said matrix passive and stable and a program for adding said vector to said last column to generate said modified block tridiagonal matrix.

16. An apparatus as set forth in claim 15 wherein said third program further comprises a program for determining eigenvalues and eigenvectors of said modified block tridiagonal matrix and determining if said modified block tridiagonal matrix is passive and stable.

17. An apparatus as set forth in claim 16 further comprising a program for running said third program repeatedly to further modify said modified block tridiagonal matrix, if said modified block tridiagonal matrix is not passive and stable.

18. An apparatus as set forth in claim 17 wherein said fourth program determines a transfer function of said stable and passive block tridiagonal matrix or said modified block tridiagonal matrix by calculating poles, zeros and residues from said eigenvalues and eigenvectors to generate a Padé approximant of a transfer function of said circuit.

19. An apparatus as set forth in claim 13 wherein said third program comprises:

a program for computing a Padé approximation of a transfer function of said block tridiagonal matrix;

a program for identifying any misplaced poles and zeros that contribute to a lack of stability or passivity of said block tridiagonal matrix;

a program for prescribing alternative locations for said identified poles and zeros;

a program for computing a partial Padé approximation of a transfer function of said matrix; and a program for checking stability and passivity of said partial Padé approximation.

20. An apparatus as set forth in claim 19 wherein said third program comprises a program for repeating said identifying, prescribing, computing and checking programs set forth in claim 19 upon said modified block tridiagonal matrix to further modify it, if said partial Padé approximation is not passive and stable.

21. An apparatus as set forth in claim 13 wherein said third program comprises:

a program for computing a row vector $\phi(\theta_j)$ for $j=1,2,\ldots,k$;

a program for computing a row vector $\psi(\tau_j)$ for $j=1,2,\ldots,l$ a program for computing a last column $R_k(:,n)$ of a matrix:

$$R_k = \Lambda_k \Phi_k - \Phi_k T_n := \mathrm{diag}(\theta_j)[\varphi(\theta_j)] - [\varphi(\theta_j)]T_n.$$

a program for computing a last column $Sl(:,n-1)$ of a matrix:

$$S_l = Y_l \psi_l - \psi_l T'_n := \mathrm{diag}(\tau_j)[\psi(\tau_j)] - [\psi(\tau_j)]T'_n; \text{ and}$$

a program for solving for $x_m$ the equation $$\begin{bmatrix} \phi_k(:,n-m+1:n) \\ \Psi_l(:,n-m:n-1) \end{bmatrix} x_m = \begin{bmatrix} R_k(:,n) \\ S_l(:,n-1) \end{bmatrix}, \text{ if } m < n.$$

or solving for x:

$$\begin{bmatrix} \phi_k \\ \tilde{\Psi}_l \end{bmatrix} x = \begin{bmatrix} R_k(:,n) \\ S_l(:,n-1) \end{bmatrix}, \text{ if } m = n, \text{ where } \tilde{\Psi}_l = [\,0 \quad \Psi_l\,].$$

22. An apparatus as set forth in claim 21 wherein said second program comprises:

a program for computing eigendecompositions of $T_n = S_n \mathrm{diag}(\lambda_j) S_n^{-1}$ and $T'_n \mathrm{diag}(\lambda'_j)(S'_n)^{-1}$ and obtaining approximate poles and zeros $$p_j = s_0 + 1/\lambda_j \text{ and } z_j = s_0 + 1/l'_j,$$

respectively; and a program for checking stability and/or passivity. If the reduced-order model defined by $T_n$ is stable and/or passive.

23. An apparatus as set forth in claim 22 wherein said third program comprises:

a program for computing eigendecompositions of $$\hat{T}_n = T_n + x e_n^T = \hat{S}_n \mathrm{diag}(\hat{\lambda}_j) \hat{S}_n^{-1}$$

and $$\hat{T}'_n = T'_n + x' e_{n-1}^T = \hat{S}'_n \mathrm{diag}(\hat{\lambda}'_j)(\hat{S}'_n)^{-1}$$

and obtaining the modified approximate poles and zeros $$\hat{p}_j = s_0 + 1/\hat{\lambda}_j \text{ and } \hat{z}_j = s_0 + 1/\hat{\lambda}'_j.$$

a program for checking stability and passivity; and a program for computing the poles and zeros and residues of the modified reduced order model $$\hat{H}_n(s_0 + \sigma) = (l^T r) e_l^T (I - \sigma \hat{T}_n)^{-1} e_l.$$

24. A method for generating a frequency response signal of a circuit, the method comprising the steps of:

providing circuit characteristic data associated with the circuit;

generating, from circuit characteristic data, a block tridiagonal matrix relating to the circuit characteristic data;

determining if said block tridiagonal matrix is stable and passive;

modifying said block tridiagonal matrix to make it stable and passive, if said block tridiagonal matrix is not stable and passive; and producing a frequency response signal as a function of said stable and passive block tridiagonal matrix or modified block tridiagonal matrix.

25. A method as set forth in claim 24 wherein said determining step comprises generating eigenvalues and eigenvectors of said tridiagonal matrix.

26. A method as set forth in claim 25 wherein said modifying step comprises the steps of:
    determining a vector that can be added to a last column of said tridiagonal matrix that will make said matrix passive and stable; and
    adding said vector to said last column to generate said modified block tridiagonal matrix.

27. A method as set forth in claim 26 wherein said modifying step further comprises;
    determining eigenvalues and eigenvectors of said modified block tridiagonal matrix; and
    determining if said modified block tridiagonal matrix is passive and stable.

28. A method as set forth in claim 27 further comprising the step of:
    repeating said modifying step to further modify said modified block tridiagonal matrix, if said modified block tridiagonal matrix is not passive and stable.

29. A method as set forth in claim 28 wherein said producing step comprises the step of determining said transfer function by calculating poles, zeros and residues from said eigenvalues and eigenvectors to generate a Padé approximant of a transfer function of said circuit.

30. A method as set forth in claim 29 wherein said generating step comprises the steps of:
    processing said circuit characteristic data to obtain a characteristic matrix and a characteristic vector of said circuit; and
    reducing the characteristic matrix to produce said block tridiagonal matrix by a look-ahead Lanczos procedure.

31. A method as set forth in claim 24 wherein said modifying step comprises the steps of:
    identifying any misplaced poles and zeros that contribute to a lack of stability or passivity of said block tridiagonal matrix;
    prescribing alternative locations for said identified poles and zeros to generate said modified block tridiagonal matrix;
    computing a partial Padé approximation of a transfer function of said modified block tridiagonal matrix; and
    checking stability and passivity of said partial Padé approximation.

32. An apparatus as set forth in claim 31 wherein said modifying step further comprises repeating said identifying, prescribing, computing and checking steps set forth in claim 31 upon said modified block tridiagonal matrix to further modify it, if said partial Padé approximation is not passive and stable.

33. An apparatus as set forth in claim 24 wherein said modifying step comprises the steps of:
    computing a row vector $\phi(\theta_j)$ for j=1,2, . . . ,k;
    computing a row vector $\psi(\tau_j)$ for j=1,2, . . . ,l;
    computing a last column $R_k(:,n)$ of a matrix:

$$R_k = \Lambda_k \Phi_k - \Phi_k T_n := \text{diag}(\theta_j)[\varphi(\theta_j)] - [\varphi(\theta_j)]T_n.$$

computing a last column $Sl(:,n-1)$ of a matrix:

$$S_l = Y_l \psi_l - \psi_l T'_n := \text{diag}(\tau_j)[\psi(\tau_j)] - [\psi(\tau_j)]T'_n; \text{ and}$$

solving for $x_m$ the equation $$\begin{bmatrix} \phi_k(:,n-m+1:n) \\ \Psi_l(:,n-m:n-1) \end{bmatrix} x_m = \begin{bmatrix} R_k(:,n) \\ S_l(:,n-1) \end{bmatrix}, \text{ if } m < n.$$

Or solve for x:

$$\begin{bmatrix} \phi_k \\ \Psi_l \end{bmatrix} x = \begin{bmatrix} R_k(:,n) \\ S_l(:,n-1) \end{bmatrix}, \text{ if } m = n, \text{ where } \Psi_l = [\,0 \quad \Psi_l\,].$$

34. An apparatus as set forth in claim 33 wherein said determining step comprises the steps of:
    computing eigendecompositions of $T_n = S_n \text{diag}(\lambda_j) S^{-1}_n$ and $T'_n \text{diag}(\lambda'_j)(S'_n)$ and obtaining approximate poles and zeros $$p_j = s_0 + 1/\lambda_j \text{ and } z_j = s_0 + 1/\lambda'_j,$$

respectively; and
    checking stability and/or passivity; and
    if the reduced-order model defined by $T_n$ is stable and/or passive, then setting $$\hat{T}_n = T_n.$$

35. An apparatus as set forth in claim 34 wherein said modifying step comprises the steps of:
    computing eigendecompositions of $$\hat{T}_n = T_n + xe_n^T = \hat{S}_n \text{diag}(\hat{\lambda}_j)\hat{S}_n^{-1}$$

and $$\hat{T}'_n = T'_n + x'e_{n-1}^T = \hat{S}'_n \text{diag}(\hat{\lambda}'_j)(\hat{S}'_n)^{-1}$$

and obtaining modified approximate poles and zeros $$\hat{p}_j = s_0 + 1/\hat{\lambda}_j \text{ and } \hat{z}_j = s_0 + 1/\hat{\lambda}'_j.$$

checking stability and passivity; and
    computing poles and zeros and residues of said modified block tridiagonal matrix $$\hat{H}_n(s_0+\sigma) = (l^T r) e_l^T (I - \sigma \hat{T}_n)^{-1} e_l.$$

36. An apparatus comprising:
    a processing unit having:
        a memory for storing circuit characteristic data representing a circuit;
        a first program for generating, from circuit characteristic data, a block tridiagonal matrix relating to the circuit characteristic data;
        a second program for determining if said block tridiagonal matrix is stable and passive;
        a third program for modifying said block tridiagonal matrix to make it stable and passive, if said block tridiagonal matrix is not stable and passive; and
        a fourth program for generating a frequency response signal as a function of said stable and passive block tridiagonal matrix or modified block tridiagonal matrix; and
    an output device for displaying said circuit frequency response signal.

37. An apparatus comprising:

a memory for storing circuit characteristic data representing a circuit;
- a first program for generating, from circuit characteristic data, a block tridiagonal matrix relating to the circuit characteristic data;
- a second program for determining if said block tridiagonal matrix is stable and passive; and
- a third program for modifying said block tridiagonal matrix to make it stable and passive, if said block tridiagonal matrix is not stable and passive;
- a processor for executing the programs; and
- means for generating a frequency response signal in response to the matrix transfer function data.

* * * * *